United States Patent
Becker et al.

(10) Patent No.: US 8,018,261 B2
(45) Date of Patent: Sep. 13, 2011

(54) CLOCK GENERATOR AND METHODS USING CLOSED LOOP DUTY CYCLE CORRECTION

(75) Inventors: Eric Becker, Boise, ID (US); Eric Booth, Boise, ID (US); Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/079,330

(22) Filed: Mar. 25, 2008

(65) Prior Publication Data
US 2009/0243677 A1     Oct. 1, 2009

(51) Int. Cl.
*H03K 3/017*     (2006.01)
(52) U.S. Cl. .................. 327/175; 327/158
(58) Field of Classification Search .......... None
See application file for complete search history.

(56) References Cited

U.S. PATENT DOCUMENTS

| | | | | |
|---|---|---|---|---|
| 7,227,809 B2 | 6/2007 | Kwak | | 365/233 |
| 7,279,946 B2 * | 10/2007 | Minzoni | | 327/158 |
| 7,332,948 B2 * | 2/2008 | Park et al. | | 327/175 |
| 7,372,311 B2 * | 5/2008 | Kang | | 327/158 |
| 7,560,963 B2 * | 7/2009 | Yun et al. | | 327/158 |
| 7,688,124 B2 * | 3/2010 | Choi | | 327/158 |
| 7,706,210 B2 * | 4/2010 | Kim et al. | | 365/233.1 |
| 2006/0202732 A1 * | 9/2006 | Deivasigamani et al. | | 327/291 |
| 2008/0098176 A1 * | 4/2008 | Krishna et al. | | 711/137 |
| 2008/0204198 A1 * | 8/2008 | Qi | | 340/10.1 |
| 2008/0290919 A1 * | 11/2008 | Lee | | 327/161 |

OTHER PUBLICATIONS

Matano et al., "A 1-Gb/s/pin 512-Mb DDRII SDRAM Using a Digital DLL and a Slew-Rate-Controlled Output Buffer", IEE Journal of Solid-State Circuits, vol. 38, No. 5, May 2003, pp. 762-768.

* cited by examiner

*Primary Examiner* — Lincoln Donovan
*Assistant Examiner* — Sibin Chen
(74) *Attorney, Agent, or Firm* — Dorsey & Whitney LLP

(57) ABSTRACT

Closed-loop duty-cycle correctors (DCCs), clock generators, memory devices, systems, and methods for generating an output clock signal having a particular duty cycle are provided, such as clock generators configured to generate an output clock signal synchronized with a received input clock signal having a predetermined duty cycle. Embodiments of clock generators include closed-loop duty cycle correctors that receive an already-controlled and corrected output signal. For example, DLL control circuitry and DCC control circuitry may each adjust a delay of a variable delay line. The DLL control circuitry adjusts the delay such that an output clock signal is synchronized with an input clock signal. The DCC control circuitry detects a duty cycle error in the output clock signal and adjusts the delay of the variable delay line to achieve a duty cycle corrected output signal. By detecting the duty cycle error in the output signal, the clock generator may achieve improved performance that can correct accumulated duty cycle error and correct for duty cycle error introduced by the duty cycle corrector itself in some embodiments.

9 Claims, 9 Drawing Sheets

CLOCK GENERATOR AND METHODS USING CLOSED LOOP DUTY CYCLE CORRECTION

TECHNICAL FIELD

This invention relates to clock generators and duty cycle correction.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to clock the commands into the latches. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. However, with higher frequency clock signals, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result of inherent delays, the commands applied to the memory device may no longer be valid by the time the internal clock signal clocks the latches. Additionally, as the frequency of the external clock increases, variations in the duty cycle of the clock signal introduce a greater duty cycle error. An ideal duty cycle for a clock signal is typically 50 percent. That is, over the period of a clock cycle, the clock signal is HIGH for 50 percent of the period. As the period of the clock signals become shorter due to the increased clock frequency, a clock variation that results in a subtle shift in duty cycle, and which can be ignored at a lower clock frequency, may result in a much more significant shift in the duty cycle of the higher frequency clock signal. In such instances, if the duty cycle of the clock signal is left uncorrected, timing errors may cause the memory device to fail.

To synchronize external and internal clock signals in modern synchronous memory devices, a number of different approaches have been considered and utilized, including delay locked loops ("DLLs") with duty cycle correction ("DCC") circuits, as will be appreciated by those skilled in the art. Examples of DLLs with duty cycle correction are described in U.S. Pat. No. 7,227,809, issued Jun. 5, 2007, entitled "Clock generator having a delay-locked loop and duty cycle correction circuit in a parallel configuration," naming Jongtae Kwak as inventor.

FIG. 1 illustrates a conventional DLL 110 and DCC circuit 120. The DLL includes an input buffer 202 that provides a buffered clock signal CLKBUF in response to receiving the CLK signal. The CLKBUF signal is delayed relative to the CLK signal due to a propagation delay of the input buffer 202. The CLKBUF signal is provided to a variable delay circuit 204 that has a variable delay controlled by an adjustment signal DADJ1 generated by a shift register 206. The output clock signal of the variable delay circuit 204 is the CLK0 signal, which is delayed relative to the CLKBUF signal by the variable delay. An output clock signal CLKSYNC is fed back through a model delay 208 to provide a feedback clock signal CLKFB1. The model delay 208 adds a delay to the CLKSYNC signal, which is approximately equal to the total delay of the input buffer 202, an output buffer 240 in the DCC 120, and the delay that is injected by the DCC circuit 120 to the CLK0 signal and a CLK180 signal. A phase detector compares the CLKBUF and CLKFB1 signals, and generates a control signal DCONT1 for the shift register 206 in response to the phase difference between the CLKBUF and CLKFB1 signals. The variable delay circuit 204 is adjusted until the variable delay is sufficient to synchronize the CLKBUF and CLKFB1 signals. When the CLKBUF and CLKFB1 signals are in phase, the DLL 110 is said to be "locked." Under this condition, the timing of the CLK0 signal is such that the delay of the output buffer 240 is accommodated, and a clock signal output by the output buffer 240 would be in phase with the CLK signal.

The CLK0 signal is provided to the DCC circuit 120 for duty cycle correction. The DCC circuit 120 includes a first variable delay 230 and a second variable delay 232, which are coupled in series. An output clock signal CLKFB2 of the variable delay 232 is compared with the CLK0 signal by a phase detector 238. The phase detector 238 generates a control signal DCONT2 that is provided to a shift register 234. The shift register 234 generates an adjustment signal DADJ2 based on the DCONT2 signal that is used to adjust both the variable delay 230 and the variable delay 232 to the same delay. When the variable delays 230, 232 have been adjusted so that the phase difference between the CLK0 and CLKFB2 signals is an odd multiple of the clock period of the CLK0 signal an output clock signal CLK180 from the first variable delay 230 is 180 degrees out of phase from the CLK0 signal. As known in the art, the delay of the feedback loop for the DCC circuit 120, which is generally defined by the variable delays 230 and 232, is equal to one period of the CLK0 signal. Thus, one-half the loop delay, that is, the delay of one of the variable delays 230 or 232, will provide a delay equal to one-half the period of the CLK0 signal, which is a clock signal 180 degrees out of phase from the CLK0 signal. The CLK0 and CLK180 signals are used by the output buffer 240 to generate the CLKSYNC signal, which is synchronized with the CLK signal and has a corrected duty cycle.

The conventional clock generator 100 shown in FIG. 1 places the DLL 110 and DCC circuit 120 in series with each other. This arrangement requires a clock signal to propagate through a plurality of adjustable delay lines, each of which have an adjustable delay that is potentially affected by such factors as the consumption of power or space, and by the operating limitations of the circuit.

Although the conventional clock generator 100 can successfully generate a synchronized clock signal having a 50% duty cycle, the conventional arrangement of the DLL 110 and the DCC circuit 120 is susceptible to several issues. One issue is clock jitter. Clock jitter is exhibited as small variations in the phase of the output clock signal that is generated by the clock generator 100. Clock jitter can be caused by small fluctuations or variations in the delay times of the delay stages found in adjustable delay lines, such as in the DLL 110 and the DCC circuit 120. As the delay times of the delay stages fluctuate, the resulting clock signal will drift or "jitter." The fluctuations in delay time can be caused by power supply noise, which affects the delay time of each active delay stages of an adjustable delay line. In a conventional arrangement of the DLL 110 and the DCC circuit 120, such as that shown in FIG. 1, having multiple adjustable delay lines (such as adjustable delay lines 204, 230, 232) coupled in series can compound a clock jitter problem. That is, a clock signal output by a first adjustable delay line will have clock jitter, and is propagated through a second adjustable delay line, which also injects jitter. The resulting clock signal output by the second adjustable delay line will have a cumulative clock jitter from both the first and second delay lines. Propagating the clock signal through one more adjustable delay line will only result in generating a clock signal having yet more clock jitter.

Other issues with the arrangement of the DLL 110 and the DCC circuit 120 of the clock generator 100 are slowness of operation and cumbersome size. The conventional clock generator 100 is slow because two different feedback loops must be locked in sequence before an acceptable CLKSYNC signal is generated. That is, in one arrangement, upon start up, the DCC 120 is synchronized before the DLL 110 is activated to provide a clock signal having the appropriate delay relative to the CLK signal. Alternatively, the DLL 110 is locked to generate a synchronized clock signal before the DCC 120 is activated for duty cycle correction. It may take the DLL 110 by itself several hundred clock cycles to obtain lock and generate a synchronized CLK0 signal. The DCC circuit 120 then takes additional time to adjust the variable delays 230 and 234 to synchronize the CLK0 signal and the CLKFB signal to provide a suitable CLK180 signal. The time for the DCC circuit 120 to lock can add a significant amount of time to the already lengthy time it takes to lock the DLL 110.

An alternative clock generation circuit placing a DLL in parallel with a DCC is described in U.S. Pat. No. 7,227,809. An embodiment of the parallel configuration is shown in FIG. 2, and the embodiment shown in FIG. 2 improves some of the jitter and slowness concerns of the design shown in FIG. 1. The parallel operation in FIG. 2 is made possible by propagating buffered complementary input signals rCLK and fCLK to both the DLL 300 and DCC circuit 308 as they are generated. The clock generator 302 includes a DLL 300 and a DCC circuit 308, having a divider block 310, and a duty error detection block 320. The DLL 300 includes an input buffer 360, but receives input clock signals CLK and CLK*. The CLK and CLK* signals are complementary clock signals and are shown in the timing diagram of FIG. 3 as not having 50% duty cycles. Buffered clock signals rCLK and fCLK are generated by the input buffer 360 in response to the CLK and CLK* signals.

The DLL 300 includes two delay lines that each corresponds to one of the buffered input signals rCLK and fCLK. The rCLK signal is provided to the adjustable delay 368 to generate a feedback signal fb that is delayed relative to the rCLK signal by an adjustable delay of the adjustable delay line 368. The fb signal is further delayed through a model delay 376 to provide a delayed feedback signal fbdly to the phase detector 380. The phase detector 380 determines the phase difference between the rCLK signal and the fbdly signal and generates a control signal indicative of the phase difference that is provided to the shift register/control circuit 372. Using the control signal, the shift register/control circuit 372 adjusts the delay of the adjustable delay line 368 until the rCLK and fbdly signals are in phase. When this occurs, the DLL 300 is described as obtaining a "locked" state, and the total delay of the fb signal relative to the CLK signal is such that an output clock signal rclk_sync, which is delayed relative to the fb signal by the propagation delay of the output buffer 388, is in phase, or synchronized, with the CLK signal.

The adjustable delay line 364, which provides a delay to the fCLK signal, is adjusted by the shift register/control circuit 372 to have the same delay as the adjustable delay line 368. As a result, the output clock signal fclk_sync is delayed relative to the fCLK signal by the same amount as the rclk_sync signal is delayed relative to the rCLK signal. Thus, the output clock signal fclk_sync is also synchronized with the CLK* signal and the complementary relationship between the rCLK and fCLK signals is maintained by the rclk_sync and fclk_sync signals.

Although the rclk_sync and fclk_sync signals are synchronized with the CLK and CLK* signals, the duty cycle of the rclk_sync and fclk_sync signals is not 50%. The DCC circuit 308 adjusts the delay of the adjustable delay line 364 to provide duty cycle corrected complementary clock signals. That is, although the respective duty cycles of the rclk_sync and fclk_sync signals remain uncorrected, duty cycle error correction is provided by changing the timing of one of the output clock signals relative to the other output clock signal to provide rising clock edges of the output clock signals corresponding to clock edges of a clock signal having a 50% duty cycle.

The duty error correction mechanism includes a divider block 310 and duty error detection block 320. The divider block 310 includes frequency divider circuits 324, 328 for generating three clock signals A, B, and C, having one-half the clock frequency of the rCLK and fCLK signals. The rCLK and fCLK signals are provided to each of the divider circuits 324, 328. The divider circuit 324 receives the rCLK signal at a rising edge input and receives the fCLK signal at a falling edge input. The divider circuit 324 generates the clock signal A by making a clock transition in the clock signals in response to the combination of a rising edge of the rCLK signal and a falling edge of the fCLK signal. The divider circuit 324 further generates the clock signal C, where the signal C is inverse of the signal A. Similarly, the divider circuit 328 generates the clock signal B by making a clock transition in the clock signals in response to a rising edge of the fCLK signal and a falling edge of the rCLK signal.

The duty error detection block 320 then receives the clock signals A, B, and C from the divider block 310. The duty error detection block includes two adjustable delay lines 332, 336, to provide adjustable delays for the clock signals A and B. In one embodiment, each adjustable delay lines 332, 336 is adjustable to provide no more than half of the adjustable delay of delay lines 364, 368 in the DLL 300. Adjustable delay lines having maximum adjustable delays other than approximately one-half the maximum delay of the delay lines 364, 368 can also be used. Using adjustable delay lines of approximately one-half the adjustable delays of the DLL has the benefits of reducing the area occupied by the adjustable delay lines 332, 336. The delay line 332 of the duty error detection block 320 receives and delays the signal A, which is then sent to a phase detector 340. The phase detector 340 receives the signal B and the delayed signal A and generates a signal representing the phase difference of the two signals. Similarly, the delay line 336 of the duty error detection block 320 receives and delays the signal B, which is then sent to a phase detector 344. The phase detector 344 receives the delayed signal B and the signal C and generates a signal representing the phase difference of the two signals. The difference signals from the phase detectors 340, 344 are provided to the adjustable delay lines 332, 336, respectively, to adjust the delay to put the delayed signal A in phase with the signal B and to put the delayed signal B in phase with the signal C. The difference signals from the phase detectors 340, 344 are also provided to the duty error calculator 356 to calculate the delay adjustment necessary to correct the duty cycle error.

The parallel arrangement of the adjustable delay lines 332, 336 of the DCC circuit 308 to the adjustable delay lines 364, 368 of the DLL 300 reduces the clock jitter due to power supply noise and improves the time and power consumption needed to generate a corrected clock signal.

The operation of the duty error calculation in FIG. 2 is illustrated in the timing diagram of FIG. 3. The input clock signals CLK and CLK* are complementary to each other and exhibit a notable distortion in the duty cycle. At the rising edge of the CLK signal, such as at time T0, the rCLK signal transitions high and at the falling edge of the CLK signal, such as at time T1, the rCLK signal transitions low. Similarly, the fCLK signal, which is out of phase by 180° with respect to the rCLK signal, transitions high and low relative to the rising and falling edges of the CLK* signal.

The divider circuit 324 generates the clock signal A having transitions when a rising edge of the rCLK signal crosses a falling edge of the fCLK signal. The signal C is the inverse of the signal A, and is also generated by the divider circuit 324. In contrast, the divider circuit 328 generates the clock signal B having transitions when a rising edge of the fCLK signal crosses a falling edge of the rCLK signal. As a result, the clock signal B generated by the divider circuit 328 has a frequency that is half the frequency of the rCLK and fCLK signals and has a 50% duty cycle.

As shown in FIG. 3, the clock signal B is out of phase relative to the clock signal A by a delay (1) that corresponds to the time the CLK signal is high (and the CLK* signal is low). As further shown in FIG. 3, the clock signal C is out of phase relative to the clock signal B by a delay (2) that corresponds to the time the CLK* signal is high (and the CLK signal is low). The delays (1) and (2) are indicative of the duty cycle distortion in the CLK and CLK* signals, and exhibited in the rCLK and fCLK signals. As a result, the delays (1) and (2) can be used to calculate a duty cycle error from a desired 50% duty cycle. More specifically, the duty cycle error is equal to $(|(1)-(2)|)/2$. The delays (1) and (2) are measured using the delay lines 332, 336 and the phase detectors 340, 344. To measure the delay (1), delayed signal A (not shown) is compared to the clock signal B by the phase detector 340. The phase detector 340 will adjust the adjustable delay line 332 until the delayed signal A is in phase with the clock signal B, that is the rising edges of the delayed signal A and the clock signal B are aligned. Consequently, when the signals are in phase, the control signal output by the phase detector 340 to set the delay of the adjustable delay line 332 is indicative of the delay (1). Similarly, to measure the delay (2), the phase detector 344 compares the delayed signal B (not shown) to signal C. As with the phase detector 340 and the adjustable delay line 332, when the adjustable delay line 336 is adjusted by the phase detector 344 so that the delay signal B and the clock signal C are in phase, the control signal output by the phase detector 344 is indicative of the delay (2). The control signals output by the phase detectors 340, 344 are provided to the duty error calculator 356. As previously discussed, the correction for achieving a 50% duty cycle can be determined by calculating half the difference between the delays (1) and (2). This calculation is conducted by the duty error calculator 356.

In summary, FIG. 1 depicts a clock generating circuit having series-connected DLL and DCC circuitry. The design in FIG. 1 suffers from the problems of clock jitter, excessive power consumption and slow time to complete locking. The design in FIG. 2 improves on FIG. 1 by placing the DLL and DCC circuitry in parallel. However, the design in FIG. 2 utilizes open-loop duty-cycle correction. Duty cycle error can be unacceptably accumulated in the design of FIG. 2 and any duty cycle error introduced by the DCC circuit itself goes uncorrected by the clock generator of FIG. 2.

Accordingly, still further improved clock generation would be desirable.

DETAILED DESCRIPTION

Figure 4:
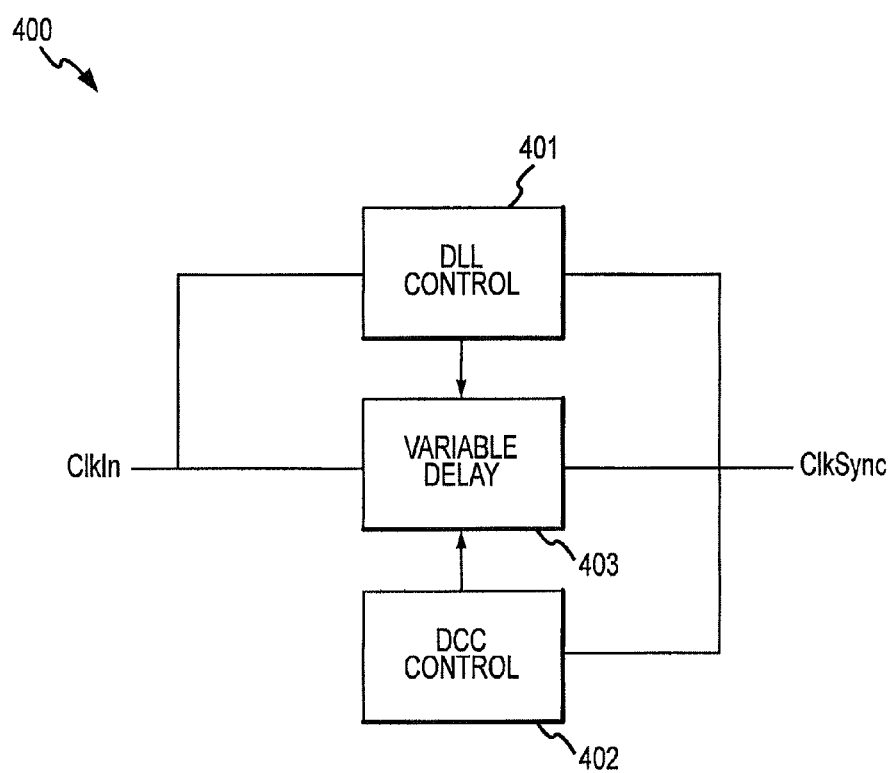
FIG. 4 is a schematic diagram of a clock generator using closed-loop duty cycle correction according to an embodiment of the present invention.

One or more embodiments of the present invention provide clock generators configured to generate a duty cycle corrected output clock signal synchronized with a received input clock signal. The output clock signal can be duty corrected to achieve a particular duty cycle. One or more embodiments of the present invention provide DLL operation in parallel with duty-cycle corrector (DCC) operation and utilize closed-loop duty cycle correction. As shown in FIG. 4, DLL control 401 and DCC control 402 operate in parallel to adjust delay of a variable delay line 403 such that an output signal ClkSync is synchronized with an input signal ClkIn and has a corrected duty cycle. The DCC control 402 operates in a closed loop in that it receives the corrected output signal ClkSync as an input. The DLL control circuitry 401 adjusts the delay 403 such that an output clock signal, ClkSync is synchronized with an input clock signal ClkIn. The DCC control circuitry 402 detects a duty cycle error in the output clock signal and adjusts the delay of the variable delay line 403 to achieve a duty cycle corrected output signal. By detecting the duty cycle error in the output signal, the signal generator 400 may have improved performance that corrects accumulated duty cycle error and is able to correct for duty cycle error introduced by the duty cycle correction circuitry itself. Furthermore, one or more embodiments of the present invention can retain parallel operation of the DLL control 401 with the DCC control 402, to retain the speed and clock jitter reduction benefits of parallel operation. While a 50% duty cycle is typically desired, and the detailed embodiments described below are described with reference to the creation of a 50% duty cycle output signal, it is to be appreciated that one or more embodiments of the present invention may be utilized to achieve any duty cycle ratio. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Furthermore, although not shown in detail in FIG. 4, the positioning of the DCC control 402 in parallel with the DLL control 401 allows the duty correction functionality of the clock generation circuit to be turned on and off as needed. A control signal applied to the duty cycle correction circuitry can disable the duty cycle correction function in some embodiments when the duty cycle correction is not needed. Accordingly, in some embodiments, duty cycle correction is performed within the clock generation circuitry only periodically, or at specific times. Turning off the duty cycle correction functionality during some period of operation of the clock generator can advantageously save power. The duty cycle correction functionality can be turned on and off such that the duty cycle of the resultant clock signal does not deteriorate unacceptably, but some power is saved.

Figure 1:
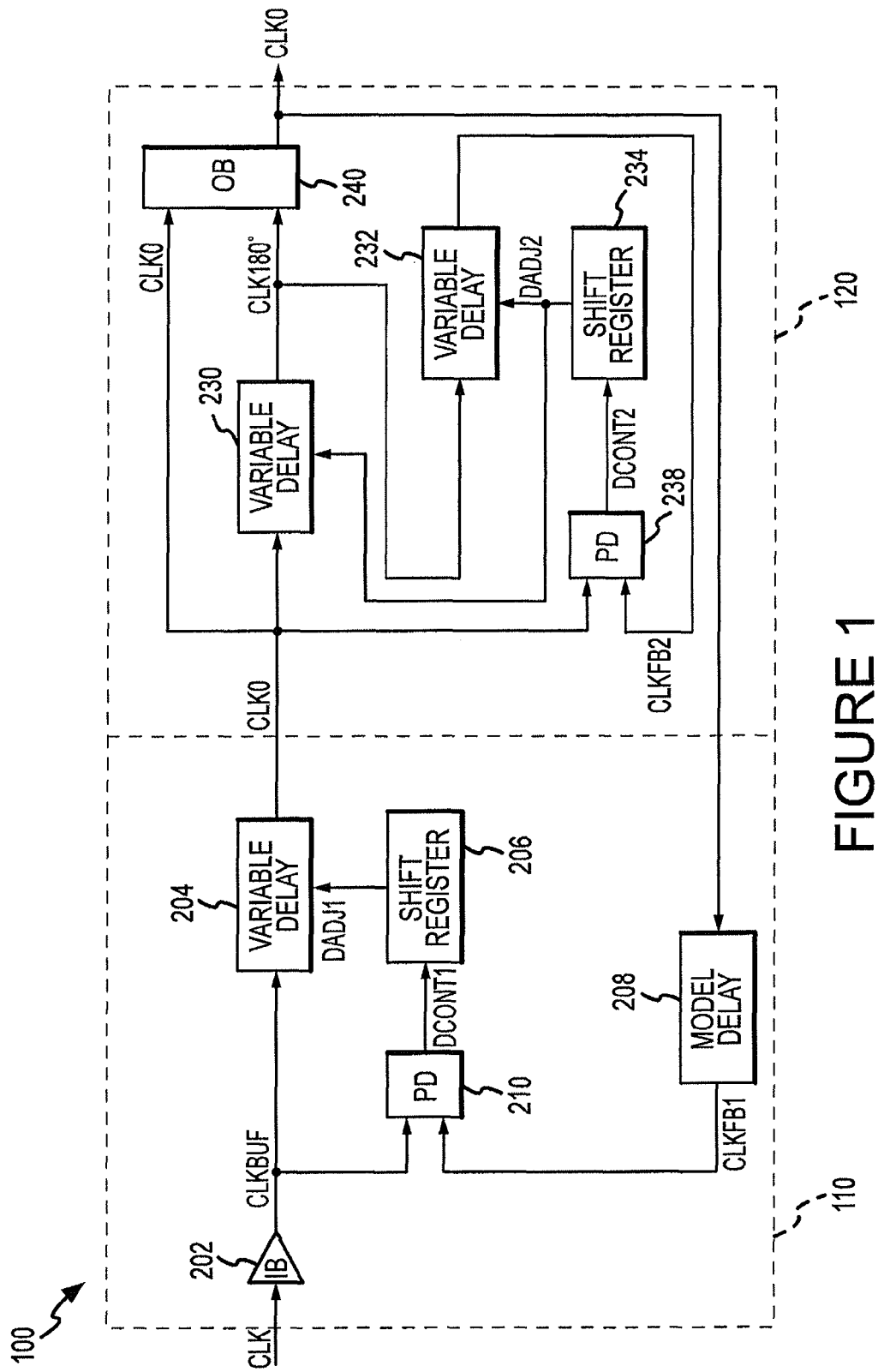
FIG. 1 is a block diagram of a conventional clock generator.
Figure 5:
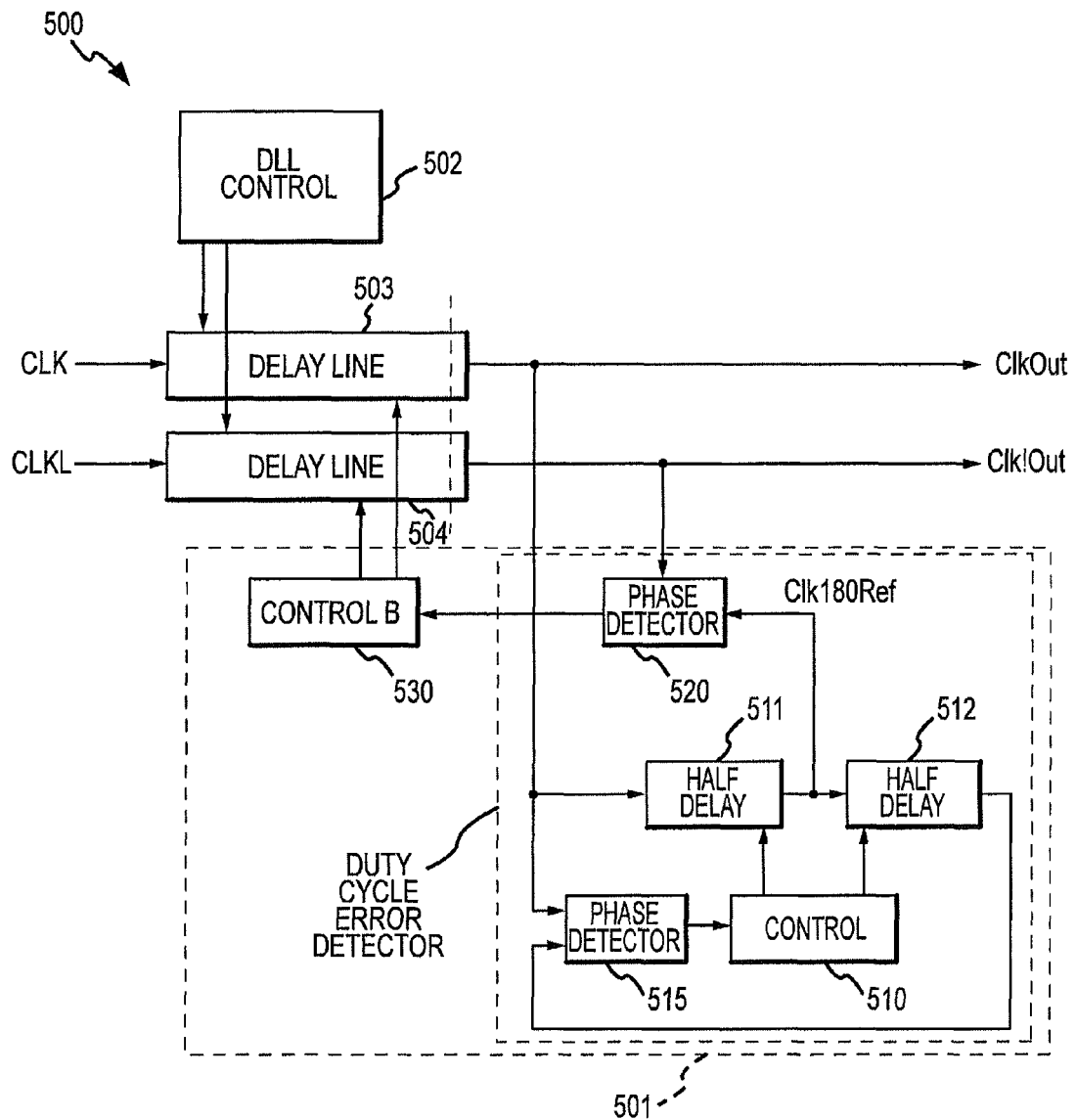
FIG. 5 is a schematic diagram of a clock generator using closed-loop duty cycle correction according to an embodiment of the present invention.

A clock generation circuit 500 according to an embodiment of the present invention is shown in FIG. 5. The clock generation circuit includes a locked loop including a control unit 502 and two variable delay lines 503 and 504. Details of the locked loop are not shown in FIG. 5, however, the locked loop operates to synchronize the input signals Clk and Clk! with the respective ClkOut and Clk180Out signals. The incoming Clk and Clk! are complementary in the embodiment of FIG. 5. The DLL control block 502 operates to select a variable delay for each of the variable delay lines 503 and 504 suitable to achieve synchronized output clock signals, ClkOut and Clk!Out, also complementary signals. The clock generation circuit 500 further includes a duty cycle corrector 501. The principle of duty cycle correction employed by the clock generation circuit 500 is similar to that of the duty cycle correction circuit shown in FIG. 1. However, in the embodiment of FIG. 5, the duty cycle corrector is closed-loop, receiving the duty-cycle corrected ClkOut and Clk!Out signals as input. A delay line 511 is coupled to receive the ClkOut signal from an output terminal of the delay line 503, and delay the received signal an amount determined by control circuitry 510 to produce a reference clock signal, labeled Clk180Ref in FIG. 5. A second delay line 512 is coupled to receive the Clk180Ref signal and delay the signal a variable amount also determined by the control circuitry 510. In the embodiment shown in FIG. 5, the control circuitry 510 is configured to select identical delays for variable delay lines 511 and 512 such that the reference clock signal Clk180Ref is 180 degrees out of phase from the ClkOut signal input to the delay line 511. A phase detector 515 is coupled to receive an output signal from the second variable delay line 512 and compare a phase of the output signal with a phase of the ClkOut signal, as shown in FIG. 5. The phase detector 515 provides results of this comparison with the control circuitry 510 to keep the ClkOut signal in phase with the output of the second variable delay line 512. In this manner, the Clk180Ref signal is generated that is 180 degrees out of phase with the ClkOut signal.

A phase detector 520 compares a phase of the Clk180Ref signal with a phase of the Clk!Out signal. The Clk!Out signal is a complementary signal to the ClkOut signal. But for a duty cycle error, then the Clk!Out signal should be in phase with the Clk180Ref signal shifted 180 degrees from the ClkOut signal. The phase detector 520 determines a phase difference between the signals, which difference is indicative of a duty cycle error, and passes results of the comparison to control unit 530. The control unit 530 adjusts the variable delay of the delay line 503, the delay line 504, or both to compensate for duty cycle error. The ClkOut and Clk!Out signals may then be used to generate a final, synchronized, duty cycle corrected output clock signal.

Figure 6:
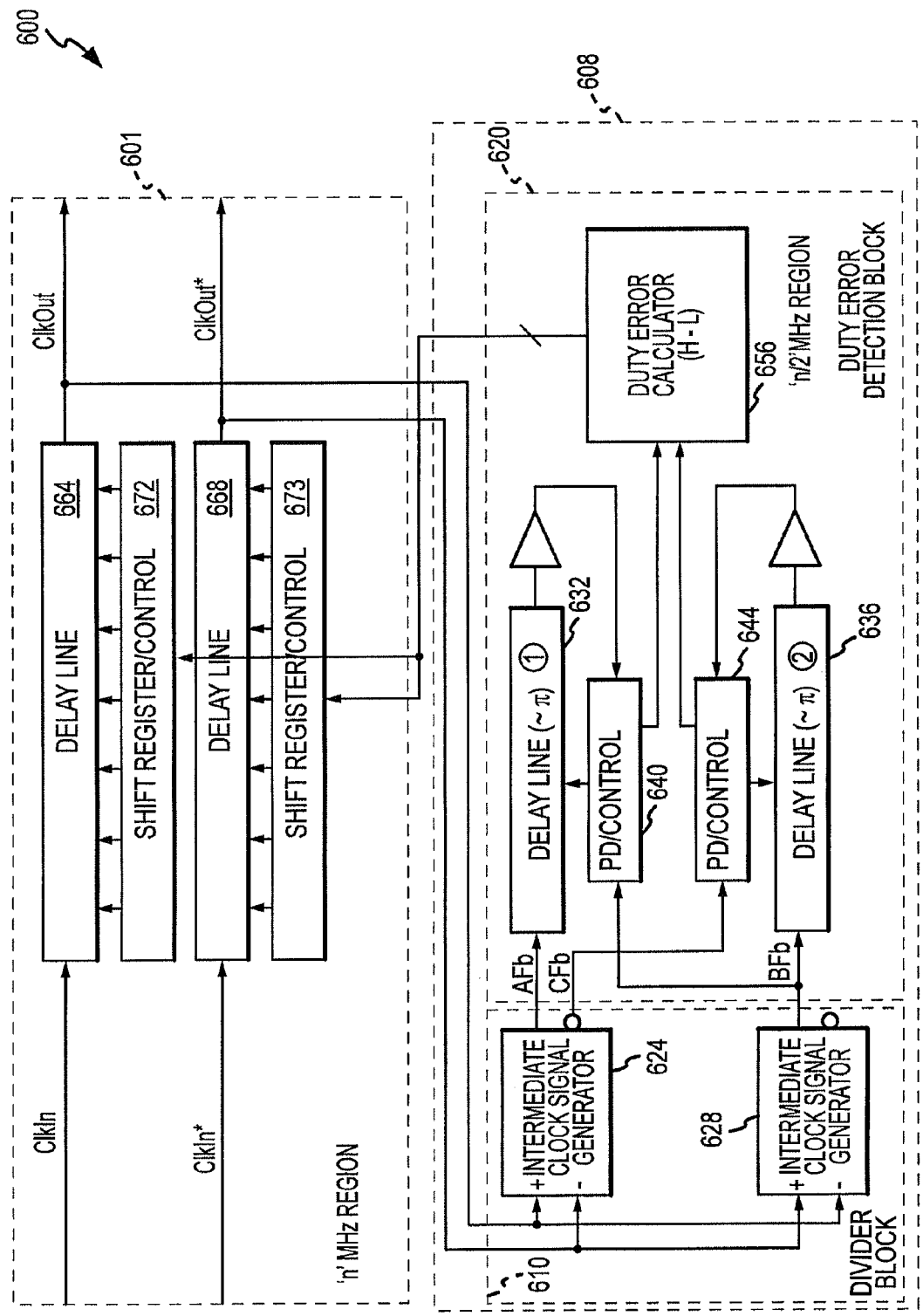
FIG. 6 is a schematic diagram of a clock generator using closed-loop duty cycle correction according to an embodiment of the present invention.

A clock generation circuit 600 according to another embodiment of the present invention is shown in FIG. 6. The clock generation circuit 600 includes a locked loop 601, not all of whose components are shown in FIG. 6. The locked loop 601 includes two delay lines 664 and 668. The delay lines receive an input clock signal, ClkIn and ClkIn*, respectively, where ClkIn* is a complementary signal to ClkIn. The delay lines 664 and 668 are configured to delay the ClkIn and ClkIn* signals a variable amount, as determined by the control blocks 672 and 673, respectively. The control blocks 672 and 673 may include shift registers, as indicated in FIG. 6. The control blocks 672 and 673 receive input from a locked loop phase detector, not shown, to select a delay for the delay lines 664 and 668 such that the ClkIn and ClkIn* signals are synchronized (e.g. "locked") to the output ClkOut and ClkOut* signals, respectively.

The clock generation circuit 600 further includes a duty cycle error corrector 608. The duty error corrector 608 implements a duty cycle error detection methodology similar to that of the circuitry shown in FIG. 2. However, the duty error corrector 608 receives the ClkOut and ClkOut* signals as inputs, such that the duty error corrector 608 operates in a closed loop with the delay lines 664 and 668. By forming a closed loop, duty error accumulation may be reduced and duty cycle error introduced by the duty error detector 608 itself can be corrected. Generally, the duty error corrector 608 operates by utilizing high and low pulse detection. As is described further with reference to the embodiment shown in FIG. 6, a first intermediate signal is generated having transitions between a high and low state corresponding to rising edges of one of the ClkOut or ClkOut* signals. A second intermediate signal is generated having transitions between a high and low state corresponding to falling edges of the ClkOut or ClkOut* signals. By comparing these intermediate signals, or more generally, by comparing the rising and falling edges of the ClkOut and ClkOut* signals, duty cycle error can be determined.

The duty error corrector 608 includes a divider block 610 and duty error detection block 620. The divider block 610 includes frequency divider circuits 624, 628 for generating three clock signals AFb, BFb, and CFb, having one-half the clock frequency of the ClkOut and ClkOut* signals. The ClkOut and ClkOut* signals are provided to each of the divider circuits 624, 628. The divider circuit 624 receives the ClkOut signal at a rising edge input and receives the ClkOut* signal at a falling edge input. The divider circuit 624 generates the clock signal AFb by making a clock transition in the clock signals in response to the combination of a rising edge of the ClkOut signal and a falling edge of the ClkOut* signal. The divider circuit 624 further generates the clock signal CFb, where the signal CFb is inverse of the signal AFb. Similarly, the divider circuit 628 generates the clock signal BFb by making a clock transition in the clock signals in response to a rising edge of the ClkOut* signal and a falling edge of the ClkOut signal.

The duty error detection block 620 then receives the clock signals AFb, BFb, and CFb from the divider block 610. The duty error detection block includes two adjustable delay lines 632, 636, to provide adjustable delays for the clock signals AFb and BFb. Using adjustable delay lines of approximately one-half the adjustable delays of the DLL (664, 668) can have the benefits of reducing the area occupied by the adjustable delay lines 632, 636. The delay line 632 of the duty error detection block 620 receives and delays the signal AFb, which is then sent to a phase detector 640. The phase detector 640 receives the signal BFb and the delayed signal AFb and generates a signal representing the phase difference of the two signals. Similarly, the delay line 636 of the duty error detection block 620 receives and delays the signal BFb, which is then sent to a phase detector 644. The phase detector 644 receives the delayed signal BFb and the signal CFb and generates a signal representing the phase difference of the two signals. The difference signals from the phase detectors 640, 644 are provided to the adjustable delay lines 632, 636, respectively, to adjust the delay to put the delayed signal AFb in phase with the signal BFb and to put the delayed signal BFb in phase with the signal CFb. The difference signals from the phase detectors 640, 644 are also provided to the duty error calculator 656 to calculate the delay adjustment necessary to correct the duty cycle error detected.

Figure 7:
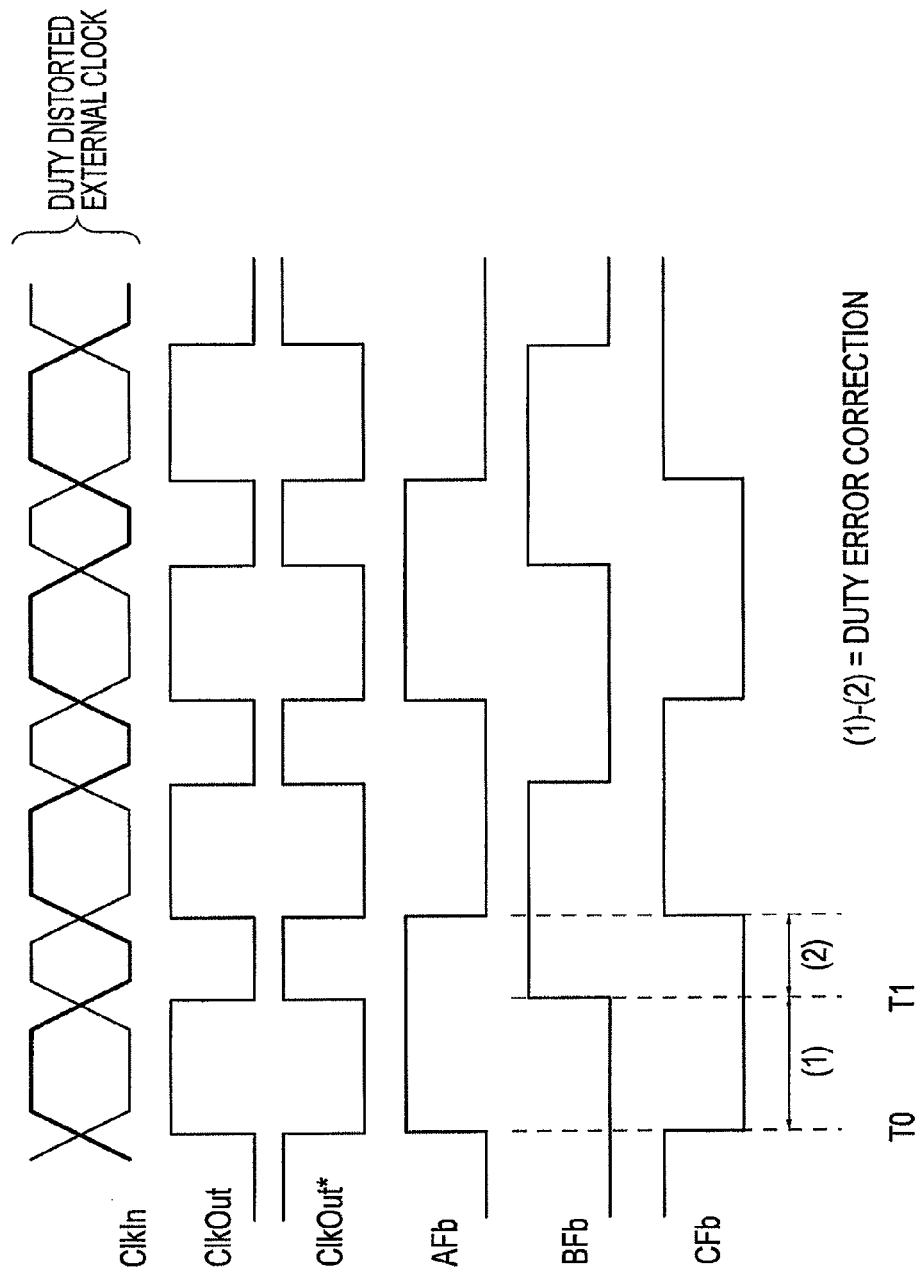
FIG. 7 is a timing diagram demonstrating operation of the generator shown in FIG. 6 according to an embodiment of the present invention.

The operation of the duty error correction of FIG. 6 is illustrated in the timing diagram of FIG. 7. The input clock signals ClkIn and ClkIn* are complementary to each other and may exhibit distortion in the duty cycle, as shown in FIG. 7. DLL circuitry keeps the ClkIn and ClkIn* signals synchronized with the ClkOut and ClkOut* signals respectively. Accordingly, at the rising edge of the ClkIn signal, such as at time T0, the ClkOut signal transitions high and at the falling edge of the ClkIn signal, such as at time T1, the ClkOut signal transitions low. Similarly, the ClkOut* signal, which is inverse with respect to the ClkOut signal, transitions high and low relative to the rising and falling edges of the ClkIn* signal.

The divider circuit 624 generates the clock signal A having transitions when a rising edge of the ClkOut signal crosses a falling edge of the ClkOut* signal. The signal CFb is the inverse of the signal AFb, and is also generated by the divider circuit 624. In contrast, the divider circuit 628 generates the clock signal BFb having transitions when a rising edge of the ClkOut* signal crosses a falling edge of the ClkOut signal. As a result, the clock signal BFb generated by the divider circuit 628 has a frequency that is half the frequency of the ClkOut and ClkOut* signals and has a 50% duty cycle.

Figure 2:
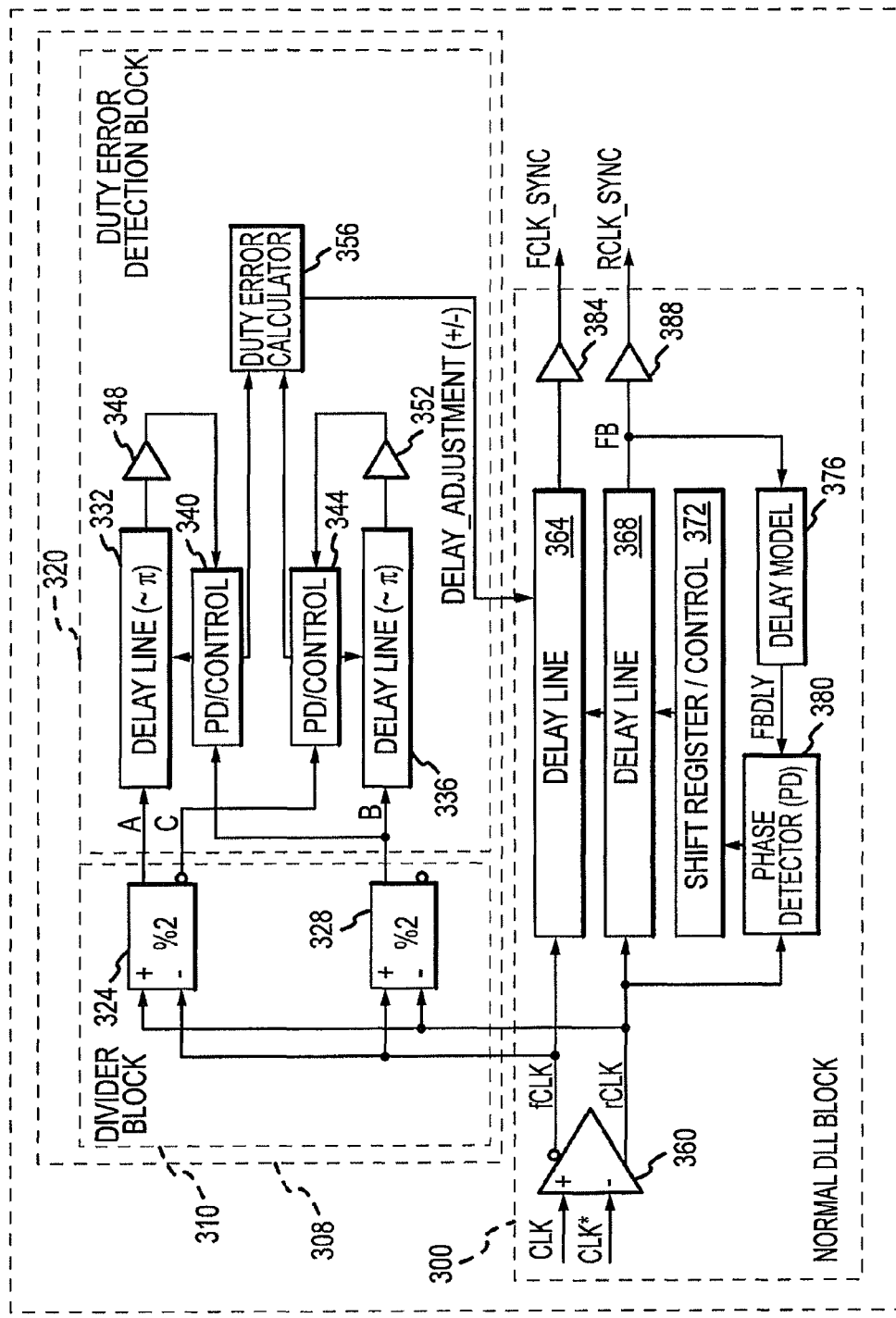
FIG. 2 is a block diagram of a clock generator including parallel DCC and DLL circuitry.
Figure 3:
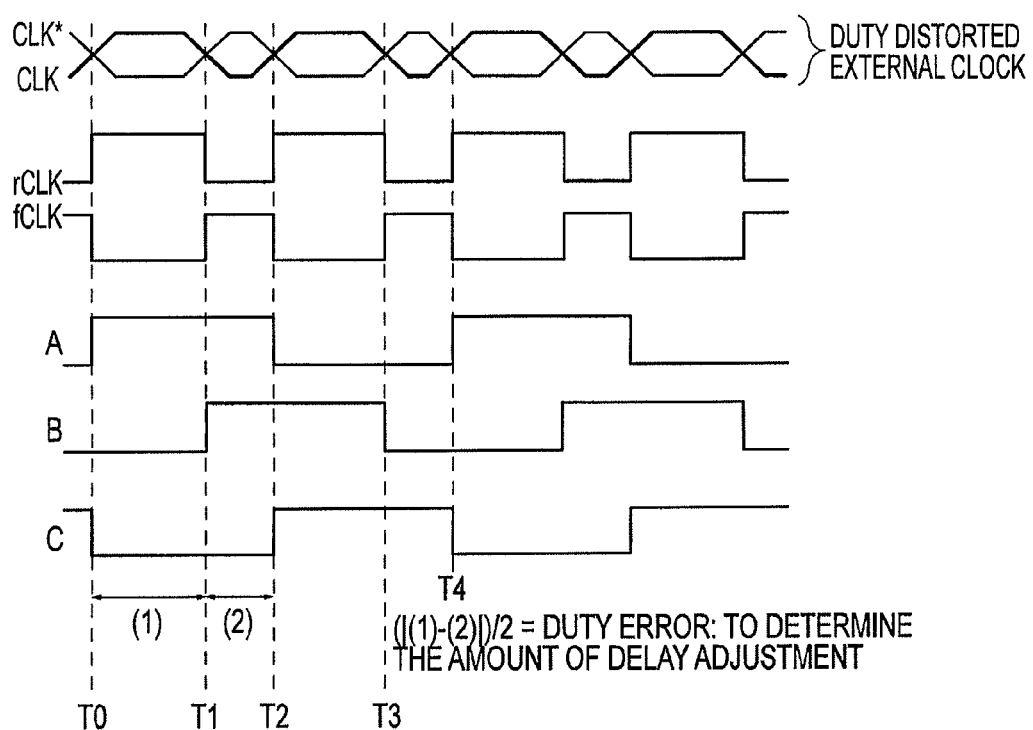
FIG. 3 is a timing diagram demonstrating operation of the clock generator of FIG. 2.

As shown in FIG. 7, the clock signal BFb is out of phase relative to the clock signal AFb by a delay (1) that corresponds to the time the ClkOut signal is high (and the ClkOut* signal is low). As further shown in FIG. 3, the clock signal CFb is out of phase relative to the clock signal BFb by a delay (2) that corresponds to the time the ClkOut* signal is high (and the ClkOut signal is low). The delays (1) and (2) are indicative of the duty cycle distortion in the ClkOut and ClkOut* signals. More generally, signals AFb and BFb and/or CFb and BFb can be compared to find one length of time during which the signals have a same state and another length of time during which the signals have opposite state. A comparison of these times yields a duty cycle error. Referring to FIG. 7, the delays (1) and (2) can be used to calculate a duty cycle error from a desired duty cycle. More specifically, the duty cycle error is equal to ((1)−(2))/2. The delays (1) and (2) are measured using the delay lines 632, 636 and the phase detectors 640, 644. To measure the delay (1), delayed signal A (not shown) is compared to the clock signal BFb by the phase detector 640. The phase detector 640 will adjust the adjustable delay line 632 until the delayed signal AFb is in phase with the clock signal B, that is the rising edges of the delayed signal AFb and the clock signal BFb are aligned. Consequently, when the signals are in phase, the control signal output by the phase detector 640 to set the delay of the adjustable delay line 632 is indicative of the delay (1). Similarly, to measure the delay (2), the phase detector 644 compares the delayed signal BFb (not shown) to signal CFb. As with the phase detector 640 and the adjustable delay line 632, when the adjustable delay line 636 is adjusted by the phase detector 644 so that the delay signal BFb and the clock signal CFb are in phase, the control signal output by the phase detector 644 is indicative of the delay (2). The control signals output by the phase detectors 640, 644 are provided to the duty error calculator 656. In FIG. 2, the correction for achieving a 50% duty cycle was determined by calculating half the difference between the delays (1) and (2). However, in the closed loop embodiment of FIG. 6, adjustments in the delay line will themselves affect the inputs into the duty correction circuitry 610. Accordingly, the factor of one-half may be discarded, and the amount of delay adjustment required can be calculated directly by the difference between the delays (1) and (2). The adjustment is applied to delay line 664 or delay line 668, or some combination of the delay lines 664 and 668 to result in the needed adjustment. Because the ClkOut and ClkOut* signals are input in a closed-loop manner to the duty error detection circuitry and the output used to adjust one or both of the delay lines that produce the ClkOut and ClkOut* signals themselves, the phase response of the clock generation circuitry shown in FIG. 6 should be twice as fast as the open loop version shown in FIG. 2. In some embodiments, accuracy of the clock generation circuitry may be negatively impacted by the design of FIG. 6 relative to that of the open-loop version because the output signal will vary in addition to the variation introduced by the generation of the intermediate clock signals AFb, BFb and CFb. However, the closed-loop embodiment of FIG. 6 advantageously should correct for duty cycle error introduced by the duty error detection circuitry itself, does not accumulate duty cycle error and locks faster than an open-loop design.

Figure 8:
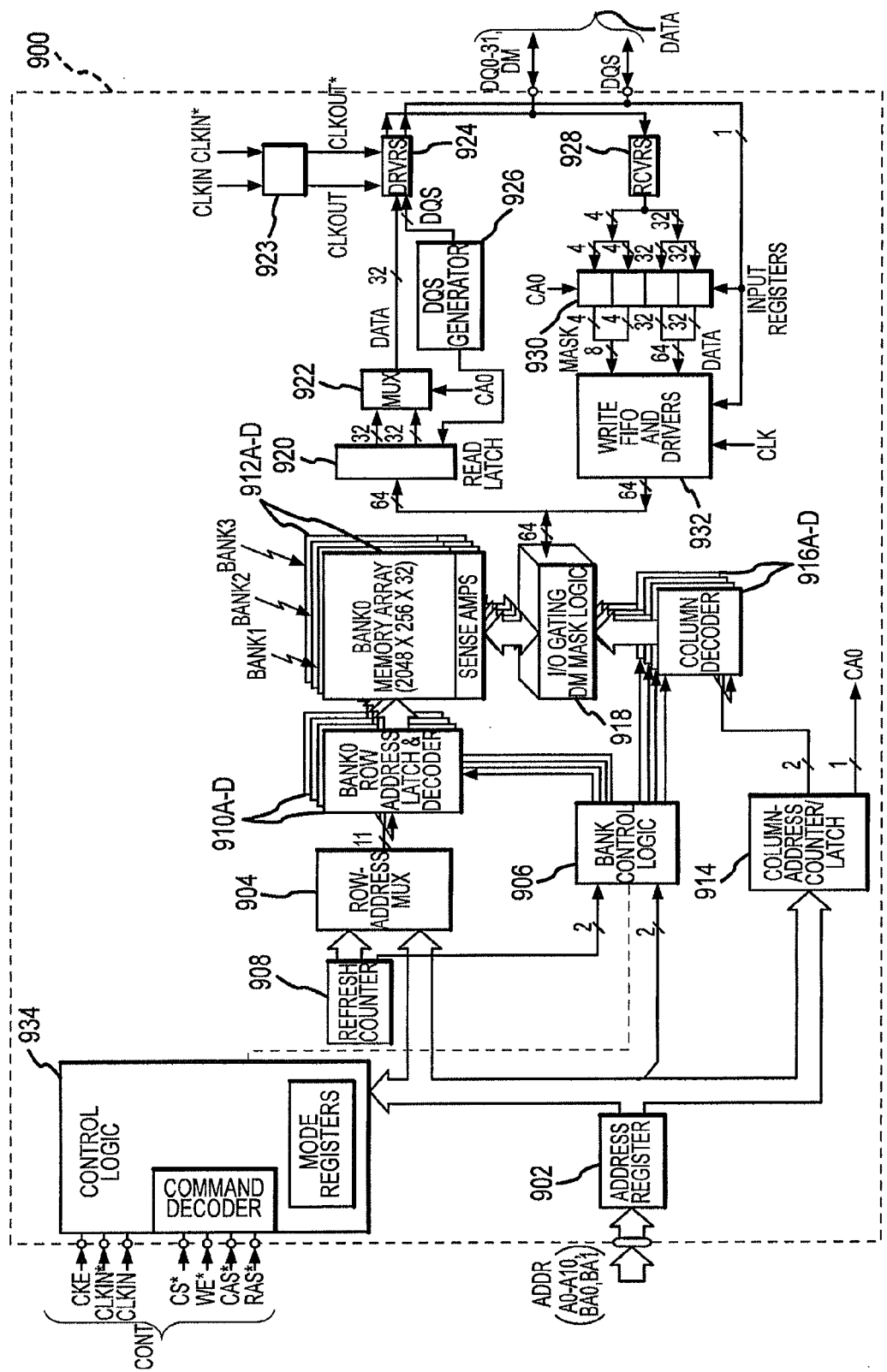
FIG. 8 is a schematic diagram of a memory device according to an embodiment of the present invention.
Figure 9:
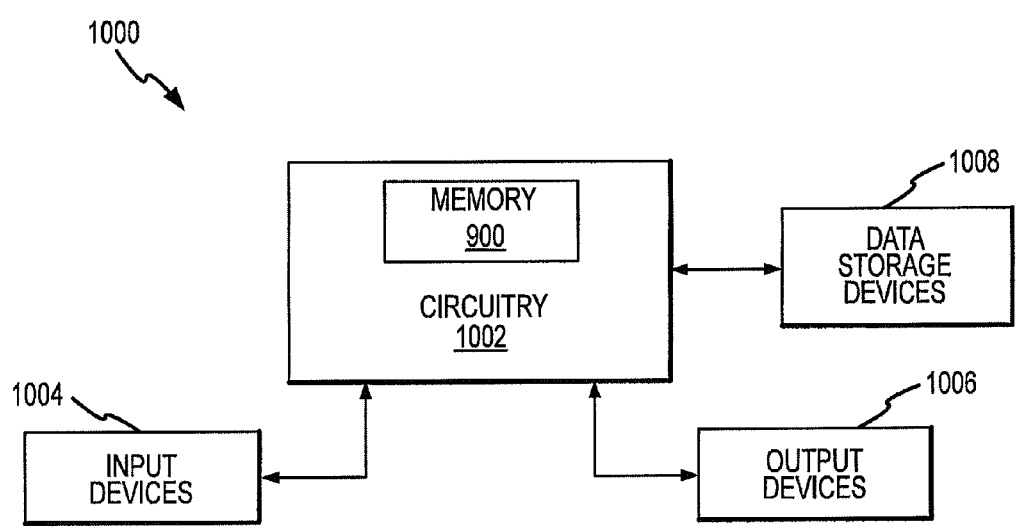
FIG. 9 is a schematic diagram of a processor-based system according to an embodiment of the present invention.

FIG. 8 is a functional block diagram of a memory device 900 including a clock generator 923 according to an embodiment of the present invention. The memory device 900 in FIG. 9 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A-D. The bank control logic 906 activates the row address latch and decoder 910A-D corresponding to either the bank address received from the address register 902 or a refresh bank address from the refresh counter 908, and the activated row address latch and decoder latches and decodes the received row address. In response to the decoded row address, the activated row address latch and decoder 910A-D applies various signals to a corresponding memory bank 912A-D to thereby activate a row of memory cells corresponding to the decoded row address. Each memory bank 912A-D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A-D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A-D. The bank control logic 906 activates the column decoder 916A-D corresponding to the received bank address, and the activated column decoder decodes the applied column address. Depending on the operating mode of the memory device 900, the column address counter and latch 914 either directly applies the latched column address to the decoders 916A-D, or applies a sequence of column addresses to the decoders starting at the column address provided by the address register 902. In response to the column address from the counter and latch 914, the activated column decoder 916A-D applies decode and control signals to an I/O gating and data masking circuit 918 which, in turn, accesses memory cells corresponding to the decoded column address in the activated row of memory cells in the memory bank 912A-D being accessed.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. The circuit 918 provides 64 bits to the read latch 920 which, in turn, provides two 32 bits words to the multiplexer 922. A data driver 924 sequentially receives the N/2 bit words from the multiplexer 922 and also receives a data strobe signal DQS from a strobe signal generator 926 and a delayed complementary clock signals ClkOut and ClkOut* from the clock generator 923. The DQS signal is used by an external circuit such as a memory controller (not shown) in latching data from the memory device 900 during read operations. In response to the delayed complementary clock signals ClkOut and ClkOut*, the data driver 924 sequentially outputs the received N/2 bits words as a corresponding data word DQ, each data word being output in synchronism with rising and falling edges of the ClkIn and ClkIn* signals that are applied to clock the memory device 900. The data driver 924 also outputs the data strobe signal DQS having rising and falling edges in synchronism with rising and falling edges of the ClkIn and ClkIn* signals, respectively. Each data word DQ and the data strobe signal DQS collectively define a data bus DATA. As will be appreciated by those skilled in the art, the ClkOut and ClkOut* signals from the DLL are delayed versions of the complementary ClkIn and ClkIn* signals, and the clock generator 923 adjusts the delay of the ClkOut and ClkOut* signals relative to the ClkIn and ClkIn* signals to ensure that the DQS signal and the DQ words are placed on the DATA bus in synchronism with the ClkIn and ClkIn* signals, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 928 receives each DQ word and the associated DM signals, and applies these signals to input registers 930 that are clocked by the DQS signal. In response to a rising edge of the DQS signal, the input registers 930 latch a first N/2 bit DQ word and the associated DM signals, and in response to a falling edge of the DQS signal the input registers latch the second N/2 bit DQ word and associated DM signals. The input register 930 provides the two latched N/2 bit DQ words as an N-bit word to a write FIFO and driver 932, which clocks the applied DQ word and DM signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A-D subject to the DM signals, which may be used to selectively mask bits or groups of bits in the DQ words (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals ClkIn, ClkIn*, with the "*" designating a signal as being active low. The command signals CS*, WE*, CAS*, and RAS* are driven to values corresponding to a particular command, such as a read, write, or auto-refresh command. In response to the clock signals ClkIn, ClkIn*, the command decoder 934 latches and decodes an applied command, and generates a sequence of clocking and control signals that control the components 902-932 to execute the function of the applied command. The clock enable signal CKE enables clocking of the command decoder 934 by the clock signals ClkIn, ClkIn*. The command decoder 934 latches command and address signals at edges of the ClkIn, ClkIn* signals (i.e., the crossing point of ClkIn going high and ClkIn* going low), while the input registers 930 and data drivers 924 transfer data into and from, respectively, the memory device 900 in response to both edges of the data strobe signal DQS and thus at double the frequency of the clock signals ClkIn, ClkIn*. This is true because the DQS signal has the same frequency as the ClkIn, ClkIn* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

FIG. 9 is a block diagram of a processor-based system 1000 including processor circuitry 1002, which includes the memory device 900 of FIG. 9. Typically, the processor circuitry 1002 is coupled through address, data, and control buses to the memory device 900 to provide for writing data to and reading data from the memory device. The processor circuitry 1002 includes circuitry for performing various processing functions, such as executing specific software to perform specific calculations or tasks. In addition, the processor-based system 1000 includes one or more input devices 1004, such as a keyboard or a mouse, coupled to the processor circuitry 1002 to allow an operator to interface with the processor-based system 1000. Typically, the processor-based system 1000 also includes one or more output devices 1006 coupled to the processor circuitry 1002, such as output devices typically including a printer and a video terminal. One or more data storage devices 1008 are also typically coupled to the processor circuitry 1002 to store data or retrieve data from external storage media (not shown). Examples of typical storage devices 1008 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Disclosed components and circuits may generally be implemented in hardware, software, or combinations thereof.

What is claimed is:

1. A closed-loop duty-cycle corrector comprising:
   a first delay line having a first input terminal, a first output terminal, and a first control terminal, the first delay line coupled to receive a first clock signal at the first input terminal, the first delay line configured to delay the first clock signal by a first variable delay amount determined by a first control signal received at the first control terminal to produce a first output signal at the first output terminal;
   a second delay line having a second input terminal, a second output terminal, and a second control terminal, the second delay line coupled to receive a second clock signal at the second input terminal, wherein the second clock signal is a complement of the first clock signal, the second delay line configured to delay the second clock signal by a second variable delay amount determined by a second control signal received at the second control terminal to produce a second output signal at the second output terminal;
   a duty cycle error detector having a third input terminal, a fourth input terminal and a third output terminal, the duty cycle error detector coupled to receive the first output signal at the third input terminal and the second output signal at the fourth input terminal, the duty cycle error detector configured to generate a duty cycle error correction signal at the third output terminal based on a deviation of the first output signal from a desired duty cycle, the duty cycle error detector comprising:
      a reference clock signal generator, the reference clock signal generator coupled to receive the first output signal and generate a reference clock signal delayed a predetermined portion of a clock cycle;
      a phase detector, the phase detector configured to receive the second output signal and the reference clock signal, the phase detector operable to generate the duty cycle error correction signal based on a comparison between a phase of the second output signal and a phase of the reference clock signal; and
   control circuitry having a fifth input terminal and a fourth output terminal, the control circuitry coupled to receive the duty cycle error correction signal at the fifth input terminal and modify at least one of the first and second variable delay amounts to compensate for the deviation from the desired duty cycle.

2. A closed loop duty cycle corrector according to claim 1, the reference clock signal generator comprising:
   a third variable delay line coupled to receive the first output signal and generate the reference clock signal based on a received third control signal;
   a fourth variable delay line coupled to receive the reference clock signal and generate a feedback clock signal based on a received fourth control signal;
   a second phase detector, the second phase detector operable to receive the first output signal and the feedback clock signal, and generate a phase error signal based on a comparison of a phase of the first output signal and a phase of the feedback clock signal;
   a reference clock control circuit, the reference clock control circuit coupled to receive the phase error signal and generate the third and fourth control signals based on the phase error signal.

3. A closed loop duty cycle corrector according to claim 2 wherein the reference clock control circuit generates the third and fourth control signals such that the third and fourth variable delay lines have equal delay and the reference clock signal is shifted one-half a clock period from the first output signal.

4. A closed loop duty cycle corrector according to claim 1 wherein the duty cycle error detector comprises:
   a duty cycle error calculator configured to determine a duty cycle error based on the first and second output signals, the duty cycle error calculator coupled to transmit the duty cycle error to the control circuitry.

5. A clock generator comprising:
   a locked loop including:
      a first variable delay line configured to delay a first input clock signal a first delay amount to produce a first output clock signal, the first delay amount selected to synchronize the first input clock signal with the first output clock signal;
      a second variable delay line configured to delay a second input clock signal a second delay amount to produce a second output clock signal, the second delay amount selected to synchronize the second input clock signal with the second output clock signal; and
   a duty cycle corrector configured to receive the first and second output clock signals, detect a duty cycle error in at least one of the output clock signals, and adjust at least one of the first and second delay amounts to compensate for the detected duty cycle error, the duty cycle corrector including:
      a third variable delay line and a fourth variable delay line, the third variable delay line configured to receive the first output clock signal and delay the first output clock signal a third delay amount to generate a reference clock signal, the fourth variable delay line configured to receive the reference clock signal and delay the reference clock signal a fourth delay amount to generate a feedback clock signal;

a first phase detector coupled to receive the first output clock signal and the feedback clock signal, the first phase detector operable to compare phases of the received signals and generate a first control signal indicative of a phase difference between the signals;

first control circuitry operable to receive the first control signal and select the third and fourth delay amounts based on the phase difference;

a second phase detector coupled to receive the second output clock signal and the reference clock signal, the second phase detector configured to compare a phase of the respective received signals and generate a second control singal indicative of the phase difference; and second control circuitry operable to receive the second control signal and modify at one or the first and second delay amounts based on the phase difference.

6. A clock generator according to claim 5 wherein the second input clock signal is a complement of the first input clock signal.

7. A clock generator according to claim 5 wherein the third and fourth delay amounts are the same.

8. A memory device comprising:

an array of memory cells;

a control circuit coupled to the array of memory cells;

a clock generator coupled to the control circuit, the clock generator comprising:

a locked loop including:

a first variable delay line configured to delay a first input clock signal a first delay amount to produce a first output clock signal;

a second variable delay line configured to delay a second input clock signal a second delay amount to produce a second output clock signal;

the first and second delay amounts selected to synchronize the first and second input clock signals with the first and second output clock signals, respectively; and a duty cycle corrector configured to receive the first and second output clock signals, detect a duty cycle error in the output clock signals, and adjust at least one of the firsts and second delay amounts to compensate for the duty cycle error in the output signal, the duty cycle corrector comprising:

a third variable delay line and a fourth variable delay line, the third variable delay line configured to receive the first output clock signal and delay the first output clock signal a third delay amount to generate a reference clock signal, the fourth variable delay line configured to receive the reference clock signal and delay the reference clock signal a fourth delay amount to generate a feedback clock signal;

a first phase detector coupled to receive the first output clock signal and the feedback clock signal, the first phase detector operable to compare phases of the received signals and generate a first control signal indicative of a phase difference between the signals; and first control circuitry operable to receive the first control signal and select the third and fourth delay amounts based on the phase difference;

a second phase detector coupled to receive the second output clock signal and the reference clock signal, the second phase detector configured to compare a phase of the respective received signals and generate a second control signal indicative of the phase difference; and second control circuitry operable to receive the second control signal and modify at least one of the first and second delay amounts based on the phase difference.

9. A processor-based system comprising:

a processor;

a memory device coupled to the processor, the memory device comprising:

an array of memory cells;

a control circuit coupled to the array of memory cells;

a clock generator coupled to the control circuit, the clock generator comprising:

a locked loop including:

a first variable delay line configured to delay a first input clock signal a first delay amount to produce a first output clock signal;

a second variable delay line configured to delay a second input clock signal a second delay amount to produce a second output clock signal;

the first and second delay amounts selected to synchronize the first and second input clock signals with the first and second output clock signals, respectively; and a duty cycle corrector configured to receive the first and second output clock signals, detect a duty cycle error in the output clock signals, and adjust at least one of the first and second delay amounts to compensate for the duty cycle error in the output signal, the duty cycle corrector comprising:

a third variable delay line and a fourth variable delay line, the third variable delay line configured to receive the first output clock signal and delay the first output clock signal a third delay amount to generate a reference clock signal, the fourth variable delay line configured to receive the reference clock signal and delay the reference clock signal a fourth delay amount to generate a feedback clock signal;

a first phase detector coupled to receive the first output clock signal and the feedback clock signal, the first phase detector operable to compare phases of the received signals and generate a first control signal indicative of a phase difference between the signals; and first control circuitry operable to receive the first control signal and select the third and fourth delay amounts based on the phase difference;

a second phase detector coupled to receive the second output clock signal and the reference clock signal, the second phase detector configured to compare a phase of the respective received signals and generate a second control signal indicative of the phase difference; and second control circuitry operable to receive the second control signal and modify at least one of the first and second delay amounts based on the phase difference.

* * * * *

UNITED STATES PATENT AND TRADEMARK OFFICE
CERTIFICATE OF CORRECTION

| | | |
|---|---|---|
| PATENT NO. | : 8,018,261 B2 | Page 1 of 1 |
| APPLICATION NO. | : 12/079330 | |
| DATED | : September 13, 2011 | |
| INVENTOR(S) | : Eric Becker et al. | |

It is certified that error appears in the above-identified patent and that said Letters Patent is hereby corrected as shown below:

In column 15, line 13, in Claim 5, delete "singal" and insert -- signal --, therefor.

In column 15, line 16, in Claim 5, delete "at one or" and insert -- at least one of --, therefor.

In column 15, line 42, in Claim 8, delete "firsts" and insert -- first --, therefor.

In column 15, line 58, in Claim 8, after "signals;" delete "and".

Signed and Sealed this
Eighth Day of November, 2011

David J. Kappos
*Director of the United States Patent and Trademark Office*